(12) United States Patent  
Camacho et al.

(10) Patent No.: US 8,493,748 B2
(45) Date of Patent: Jul. 23, 2013

(54) PACKAGING SYSTEM WITH HOLLOW PACKAGE AND METHOD FOR THE SAME

(75) Inventors: Zigmund Ramirez Camacho, Singapore (SG); Henry Descalzo Bathan, Singapore (SG); Lionel Chien Hui Tay, Singapore (SG); Jeffrey D. Punzalan, Singapore (SG)

(73) Assignee: Stats Chippac Ltd., Singapore (SG)

( * ) Notice: Subject to any disclaimer, the term of this patent is extended or adjusted under 35 U.S.C. 154(b) by 1184 days.

(21) Appl. No.: 11/769,520

(22) Filed: Jun. 27, 2007

(65) Prior Publication Data

US 2009/0002961 A1    Jan. 1, 2009

(51) Int. Cl.
*H05K 5/02* (2006.01)
*H05K 7/18* (2006.01)

(52) U.S. Cl.
USPC .......................... 361/813; 361/760; 361/764

(58) Field of Classification Search
USPC .................................. 361/813; 257/666–667
See application file for complete search history.

(56) References Cited

U.S. PATENT DOCUMENTS

| 5,485,037 | A  | * | 1/1996 | Marrs ............................ 257/712 |
| 5,608,267 | A  | * | 3/1997 | Mahulikar et al. ............ 257/796 |
| 5,710,695 | A  | * | 1/1998 | Manteghi ...................... 361/813 |
| 6,525,405 | B1 | * | 2/2003 | Chun et al. .................... 257/666 |
| 6,784,525 | B2 | * | 8/2004 | Kuan et al. .................... 257/676 |
| 7,184,202 | B2 |   | 2/2007 | Miles et al. |
| 7,202,552 | B2 |   | 4/2007 | Zhe et al. |
| 7,217,588 | B2 |   | 5/2007 | Hartzell et al. |
| 7,224,056 | B2 |   | 5/2007 | Burtzlaff et al. |
| 7,408,244 | B2 | * | 8/2008 | Lee et al. ...................... 257/666 |
| 2005/0044618 | A1 | * | 3/2005 | Shimizu et al. ................... 4/508 |
| 2006/0087795 | A1 | * | 4/2006 | Nagasawa et al. ......... 361/306.3 |
| 2007/0018301 | A1 |   | 1/2007 | Fukuda et al. |

* cited by examiner

*Primary Examiner* — Tuan T Dinh
(74) *Attorney, Agent, or Firm* — Ishimaru & Associates LLP; I-Chang John Yang

(57) ABSTRACT

A packaging system comprising: forming terminal leads; configuring a cavity by partially encapsulating the terminal leads with a compound; attaching an integrated circuit device, a micro-electromechanical system, a micro-mechanical system, or a combination thereof in the cavity; and bonding a cover to the terminal leads for enclosing the cavity.

18 Claims, 10 Drawing Sheets

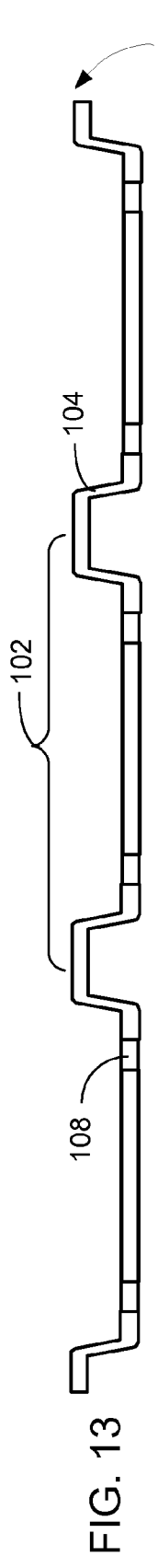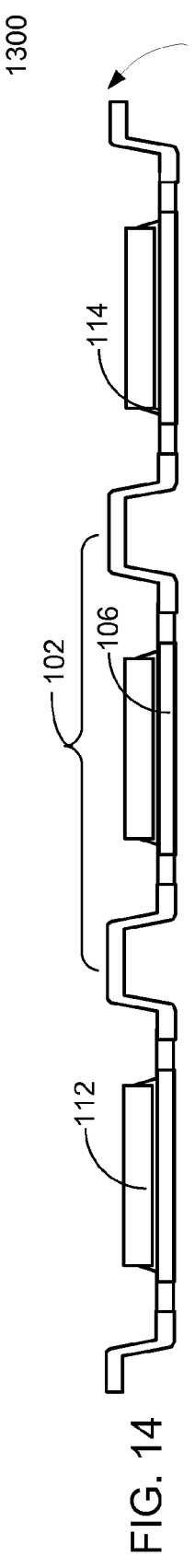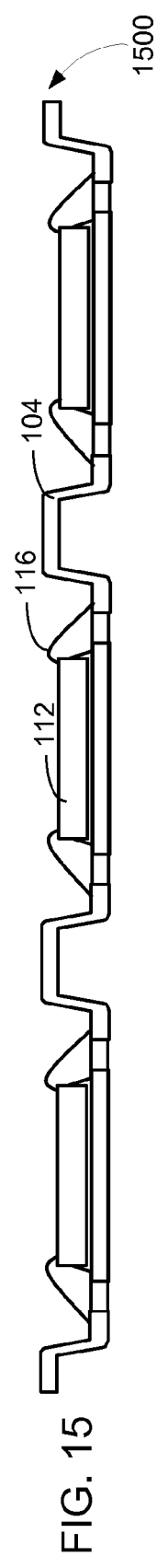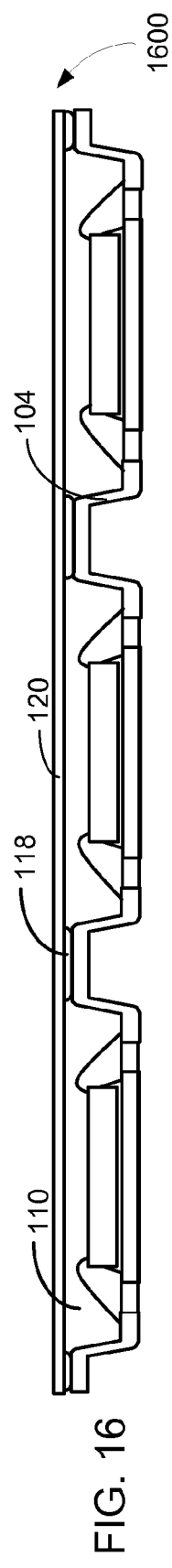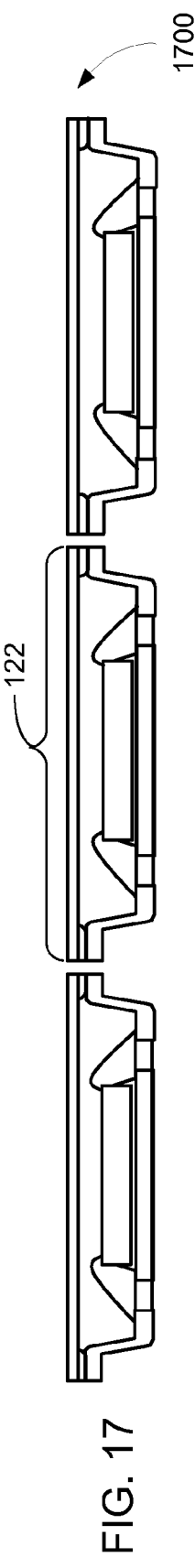

PACKAGING SYSTEM WITH HOLLOW PACKAGE AND METHOD FOR THE SAME

TECHNICAL FIELD

The present invention relates generally to integrated circuit packaging, and more particularly to a system for packaging integrated circuits and micro-electromechanical systems.

BACKGROUND ART

In the highly integrated world of cell phones, digital recording devices and personal audio players, micro-electromechanical systems and integrated circuits play a key role. These miniature devices allow functional integration to achieve extremely small form factors.

MEMS devices are typically made on silicon wafers; using one of two well established techniques: bulk micro-machining or surface micro-machining. In both of these methods, the MEMS device is fabricated on a silicon wafer using standard IC-type fabrication equipment. Once the wafer is processed, the wafer is diced to form individual die. These MEMS die may or may not be integrated with electronic components (on CMOS). Once the die is singulated, it must then be packaged in some form of package, similar to an IC package. This package is eventually inserted into a socket or bonded to a Printed Circuit Board (PCB) as part of an overall system, i.e., a cell phone. These packages can be quite elaborate, depending on the MEMS style and application, including vacuum package requirements. In addition, because many MEMS devices are required to move during operation, the package must provide a cavity that allows for this movement.

One problem with this type of MEMS packaging methodology is that the package is a very large proportion of the total MEMS device cost; on the order of 30 to 70% of the overall cost. This packaging cost can, therefore, have a significant impact on the capability of such MEMS devices to penetrate cost-sensitive markets, such as the cell phone market.

Another problem with existing MEMS packaging is the noise inherent with the electrical connections between the MEMS package and the rest of the system. The bonding, wiring, and electrical interconnections associated with interfacing a MEMS device embedded in a package, to a circuit, necessarily adds impedance mismatches that result in noisy or low amplitude signals.

However, there is mounting evidence that MEMS technology can add value to systems, such as cell phones, in a market that is ripe for new technology, if only the packaging issue could be addressed. Continuing with the cell phone example, it is certain that the camera-on-cell phone has made a great impact on the market. The search is on for the next added functionality that can drive new expansion of the cell phone market.

MEMS may be used for microphones, RF devices, image capture, identification, advanced display functionality, personal health and safety monitoring, and motion capture. The issues preventing MEMS penetration into the cell phone market are cost and performance. As mentioned above, packaging is 30 to 70% of the MEMS device cost. This cost issue is preventing the full integration of MEMS into all cell phones, display systems, and many other types of electronic devices.

MEMS devices are a logical derivative of semiconductor IC processes that may be used to develop micrometer scale structural devices such as transducers or actuators, and they are typically fabricated on silicon substrates. MEMS devices typically interface physical variables and electronic signal circuits. The integration of MEMS into larger scale systems has been expensive to fabricate due to the process difficulties and the cost associated with integrating the MEMS standard IC technologies, such as CMOS. The processes used to fabricate MEMS on glass offer the advantage that the integration of electrical and mechanical functions is easily done. In this way, system level integration is possible and cost effective.

Thus, a need still remains for a packaging system, that can facilitate a cost effective integration that meets the electrical requirements of the target application. In view of the enormous demand for increased functionality in ever smaller packages, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a packaging system comprising: forming terminal leads; configuring a cavity by connecting the terminal leads with a compound; attaching an integrated circuit device, a micro-electromechanical system, a micro-mechanical system, or a combination thereof in the cavity; and bonding a cover to the terminal leads for enclosing the cavity.

Certain embodiments of the invention have other aspects in addition to or in place of those mentioned above. The aspects will become apparent to those skilled in the art from a reading of the following detailed description when taken with reference to the accompanying drawings.

BRIEF DESCRIPTION OF THE DRAWINGS

FIG. 13 is a cross-sectional view of a lead frame sheet, in a preparation phase of manufacturing;

FIG. 14 is a cross-sectional view of the pre-molded lead frame sheet, in a die attach phase of manufacturing;

FIG. 15 is a cross-sectional view of the pre-molded lead frame sheet, in a wire bond phase of manufacturing;

FIG. 16 is a cross-sectional view of a package sheet, in a cover seal phase of manufacturing;

FIG. 17 is a cross-sectional view of the hollow package, in a singulation phase of manufacturing;

BEST MODE FOR CARRYING OUT THE INVENTION

Figure 1:
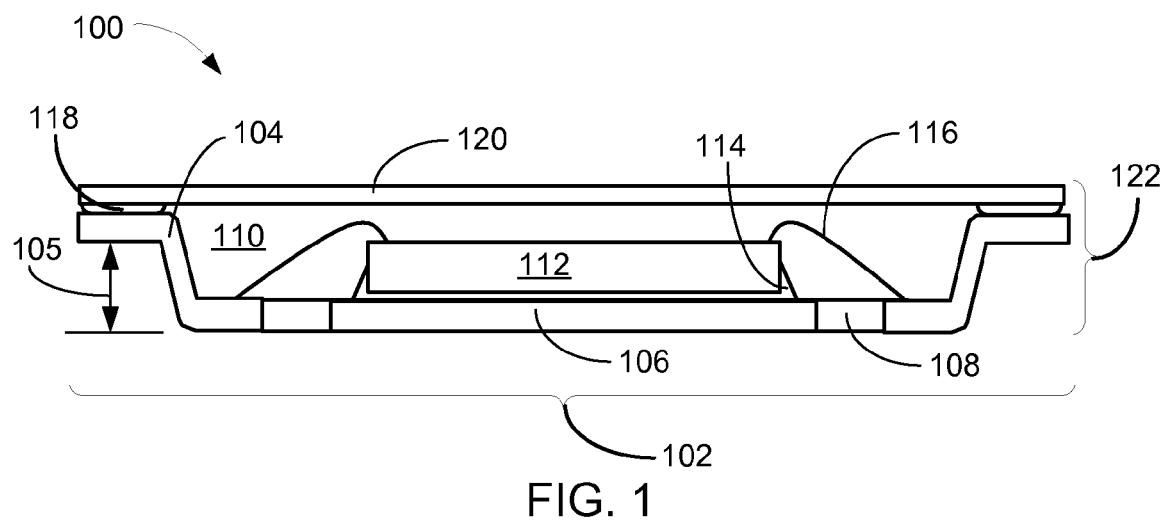
FIG. 1 is a cross-sectional view of a packaging system with hollow package, in an embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Where multiple embodiments are disclosed and described, having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the die, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "system" as used herein means and refers to the method and to the apparatus of the present invention in accordance with the context in which the term is used. The term "processing" as used herein includes stamping, forging, patterning, exposure, development, etching, cleaning, and/or removal of the material or laser trimming as required in forming a described structure.

Referring now to FIG. 1, therein is shown a cross-sectional view of a packaging system 100 with hollow package, in an embodiment of the present invention. The cross-sectional view of the packaging system 100 with hollow package depicts a lead frame 102 having a terminal lead 104 that is bent to provide a vertical displacement 105 from the plane of a die pad 106. The bend in the terminal lead 104 may be any combination of bends or arcs that provide the vertical displacement 105. The lead frame 102 may be pre-molded with a compound 108, such as a liquid crystal polymer or an epoxy molding compound. The compound 108 may partially encapsulate the lead frame 102 by filling all of the spaces between the die pad 106 and the terminal lead 104 to form a cavity 110, such as a bowl like space that is open for further assembly.

It is understood that the cavity 110 may be formed without having the die pad 106. A molded pad made from a contiguous area of the compound 108 may be sufficient to fabricate the cavity 110 for most applications.

A die 112, such as a micro-electromechanical system (MEMS), a micro-mechanical system, or an integrated circuit device may be attached to the die pad 106 by a die attach material 114. An electrical interconnect 116, such as a bond wire couples the die 112 to the terminal lead 104. An adhesive 118, such as a non-conductive adhesive, may be applied to the top surface of the terminal lead 104 and any intervening area of the compound 108. A cover 120 may be applied on the adhesive 118, such that the cover 120 is electrically isolated from the terminal lead 104, encloses the cavity 110, and forms a hollow package 122 for the die 112. The cover 120 is shown as being a top portion of the hollow package 122 with the terminal leads 104, the compound 108, the adhesive 118, and the die 112 entirely under the cover 120.

In certain applications the cover 120 may be applied while the unit is in an evacuated environment, or an environment charged with an inert gas. When the cover 120 is applied to the adhesive 118, the cavity 110 may become a sealed space housing either a vacuum or a gas.

Figure 2:
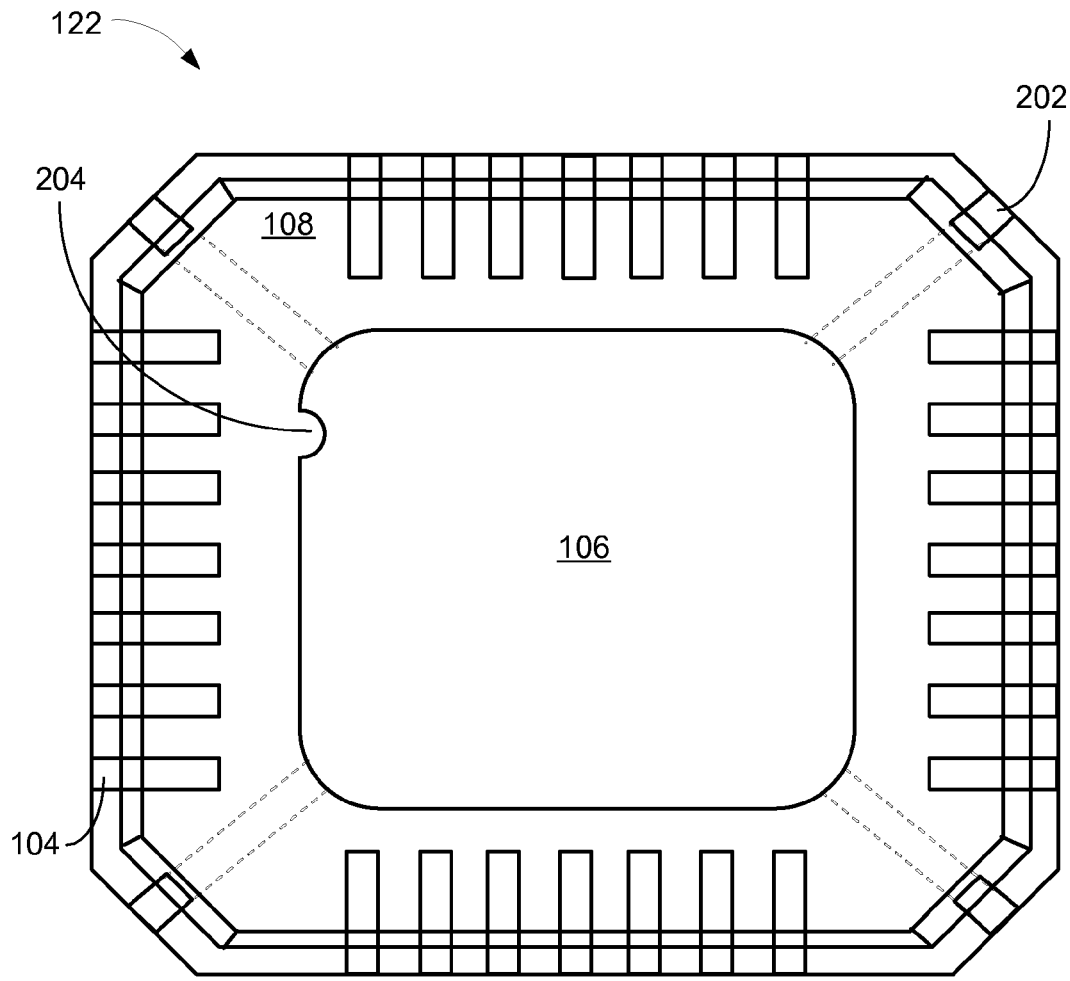
FIG. 2 is a bottom side plan view of the hollow package, of FIG. 1.

Referring now to FIG. 2, therein is shown a bottom side plan view of the hollow package 122, of FIG. 1. The bottom side plan view of the hollow package 122 depicts multiple instances of the terminal lead 104 formed in an array around the die pad 106. The compound 108 has been molded around the die pad 106 and the array of the terminal lead 104. Tie bars 202 may be half etched in order to prevent unintended electrical connections between the die pad 106 and the terminal lead 104. An orientation marker 204 may be stamped or etched into the die pad 106. In some applications the orientation marker might fill with the compound 108 that surrounds the die pad 106. The orientation marker 204 may be used to indicate the location of the terminal lead 104 that is coupled to the pin one of the die 112, of FIG. 1.

Figure 3:
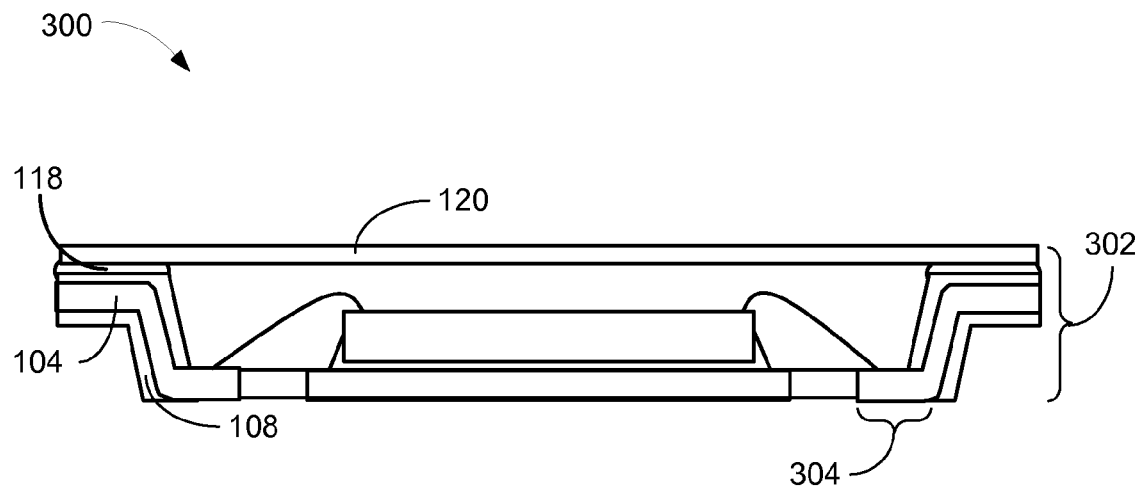
FIG. 3 is a cross-sectional view of a packaging system with hollow package, in an alternative embodiment of the present invention.

Referring now to FIG. 3, therein is shown a cross-sectional view of a packaging system 300 with hollow package, in an alternative embodiment of the present invention. The cross-sectional view of the packaging system 300 depicts the terminal lead 104 partially encased by the compound 108. The adhesive 118 may be applied on the top surface of the compound 108 in order to apply the cover 120. By doing so, a hollow package 302 may be created that provides a small contact area 304 on the terminal lead 104. In certain applications this configuration may be a more manufacturable solution for designs that have dense interconnection requirements.

Figure 4:
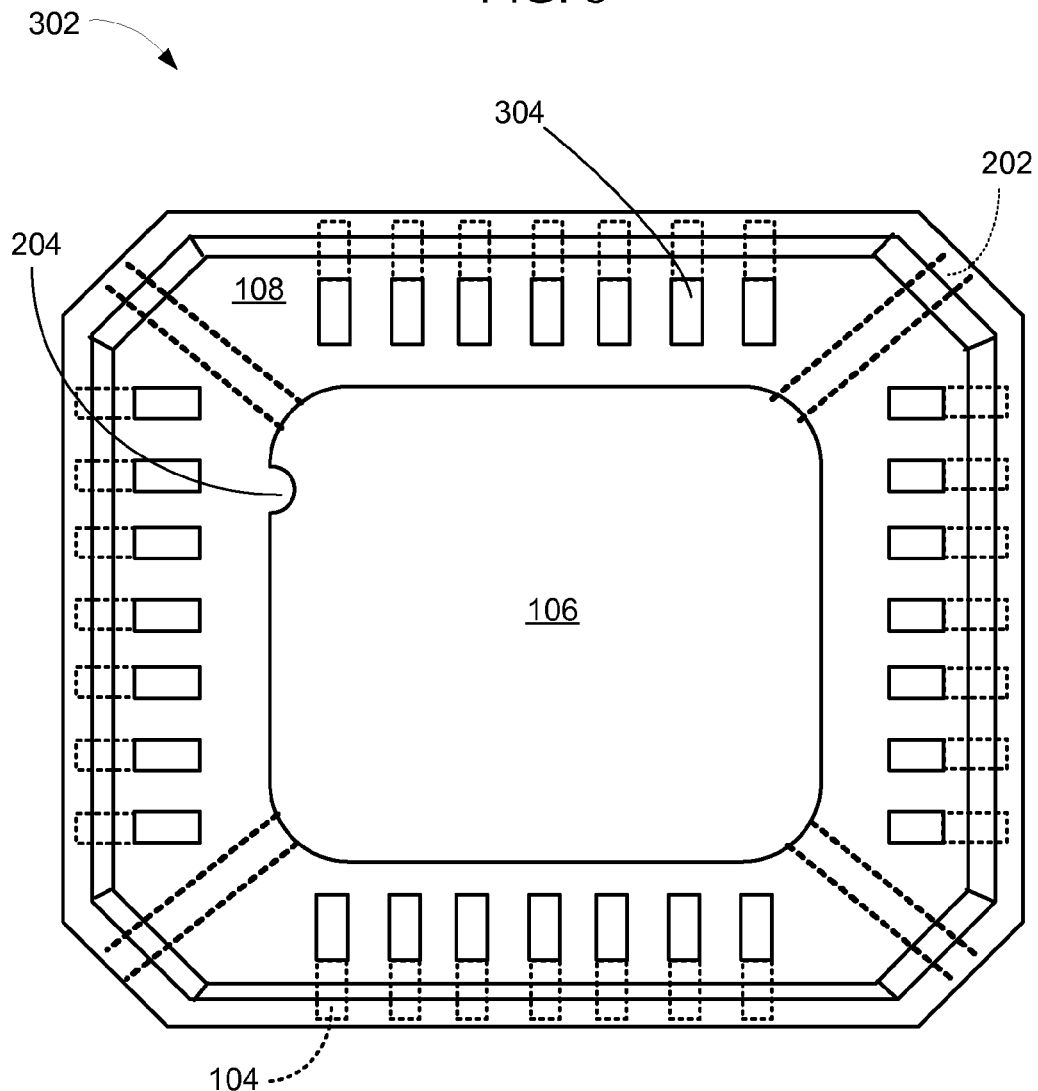
FIG. 4 is a bottom plan view of the hollow package, of FIG. 3.

Referring now to FIG. 4, therein is shown a bottom plan view of the hollow package 302, of FIG. 3. The bottom plan view of the hollow package 302 depicts the die pad 106 having the orientation marker 204 and the tie bars 202. The tie bars 202 are completely encapsulated by the compound 108. The small contact area 304 remains exposed through the compound 108 while the remainder of the terminal lead 104 is covered by the compound 108, making it unavailable for electrical connection.

Figure 5:
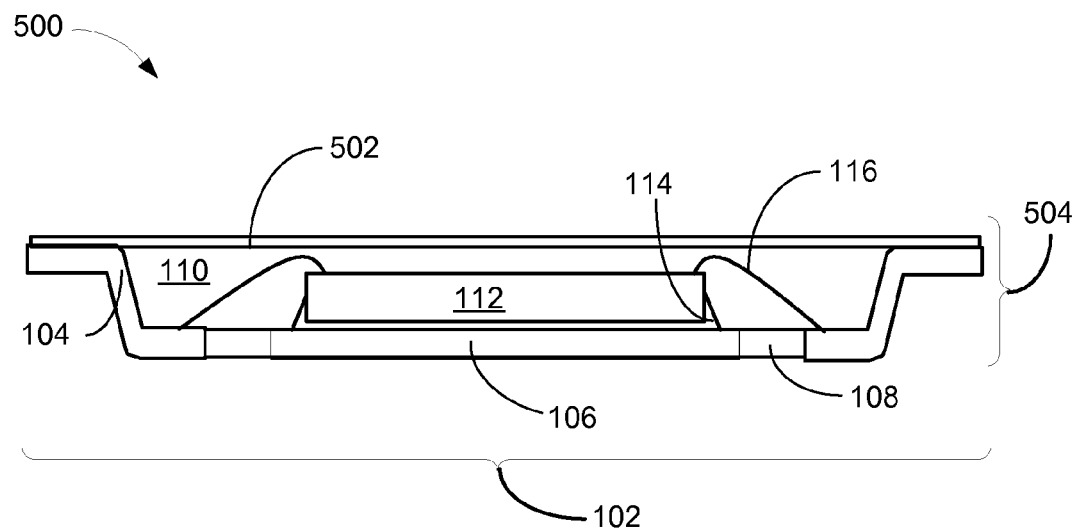
FIG. 5 is a cross-sectional view of a packaging system with hollow package, in another alternative embodiment of the present invention.

Referring now to FIG. 5, therein is shown a cross-sectional view of a packaging system 500 with hollow package, in another alternative embodiment of the present invention. The cross-sectional view of the packaging system 500 depicts the lead frame 102 having the terminal lead 104 that is vertically displaced from the plane of the die pad 106 by bends in the terminal leads 104. The lead frame 102 may be pre-molded with the compound 108, such as a liquid crystal polymer or an epoxy molding compound. The compound 108 may fill all of the spaces between the die pad 106 and the terminal lead 104 to form the cavity 110, such as a bowl like space that is open for further assembly.

The die 112, such as a MEMS, a micro-mechanical system, or an integrated circuit device may be attached to the die pad 106 by the die attach material 114. The electrical interconnect 116, such as a bond wire couples the die 112 to the terminal lead 104. A cover 502, such as a self-adhesive tape material, may be applied such that the cover encloses the cavity 110 and forms a hollow package 504 for the die 112. The use of the self-adhesive tape material to form the cover 502 reduces the number of manufacturing steps in the assembly process.

Figure 6:
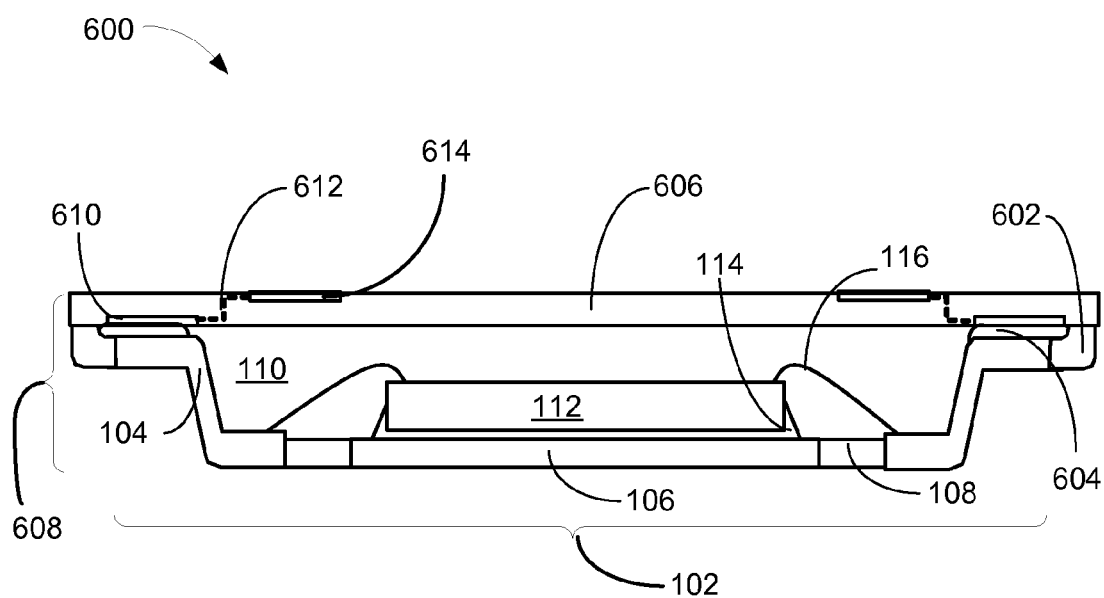
FIG. 6 is a cross-sectional view of a packaging system with hollow package, in yet another alternative embodiment of the present invention.

Referring now to FIG. 6, therein is shown a cross-sectional view of a packaging system 600 with hollow package, in yet another alternative embodiment of the present invention. The cross-sectional view of the packaging system 600 depicts the lead frame 102 having the terminal lead 104 that is vertically displaced from the plane of the die pad 106. The lead frame 102 may be pre-molded with the compound 108, such as a liquid crystal polymer or an epoxy molding compound. The compound 108 may fill all of the spaces between the die pad 106 and the terminal lead 104 to form the cavity 110, such as a bowl like space that is open for further assembly. The compound 108 may also form an end cap 602 on the terminal lead 104. The end cap 602 acts as a spacer during further assembly processing.

The die 112, such as a MEMS, a micro-mechanical system, or an integrated circuit device may be attached to the die pad 106 by the die attach material 114. The electrical interconnect 116, such as a bond wire couples the die 112 to the terminal lead 104. A conductive interconnect 604, such as solder or conductive epoxy, is applied on the top surface of the terminal lead 104 adjacent to the end cap 602. A conductive laminate substrate 606, such as a printed circuit board, a printed wiring board, a flex substrate, or a signal re-routing medium, may be applied such that the cover encloses the cavity 110 and forms a hollow package 608 for the die 112. A bottom contact pad 610 may be electrically connected to the terminal lead 104 by the conductive interconnect 604. A conductive link 612, such as printed circuit board traces, may connect a top contact pad 614 to the bottom contact pad 610. The top contact pad may be available for connection of external components (not shown), such as discrete components or an additional integrated circuit, micro-mechanical system, or MEMS package.

Figure 7:
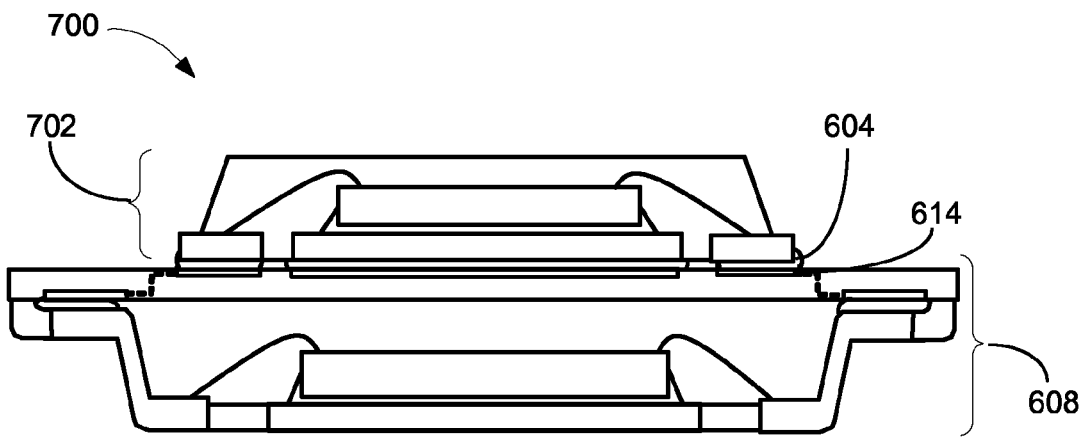
FIG. 7 is a cross-sectional view of a packaging system with hollow package, in a package on package configuration.

Referring now to FIG. 7, therein is shown a cross-sectional view of a packaging system 700 with hollow package, in a package on package configuration. The cross-sectional view of the packaging system 700 depicts the hollow package 608, having the top contact pad 614, with an additional package 702, such as an additional integrated circuit device, an additional MEMS, an additional micro-mechanical system, an additional unit of the hollow package 608, or a combination thereof mounted thereon. The conductive interconnect 604 is on the top contact pad 614 and the additional package 702 is on the conductive interconnect 604.

Figure 8:
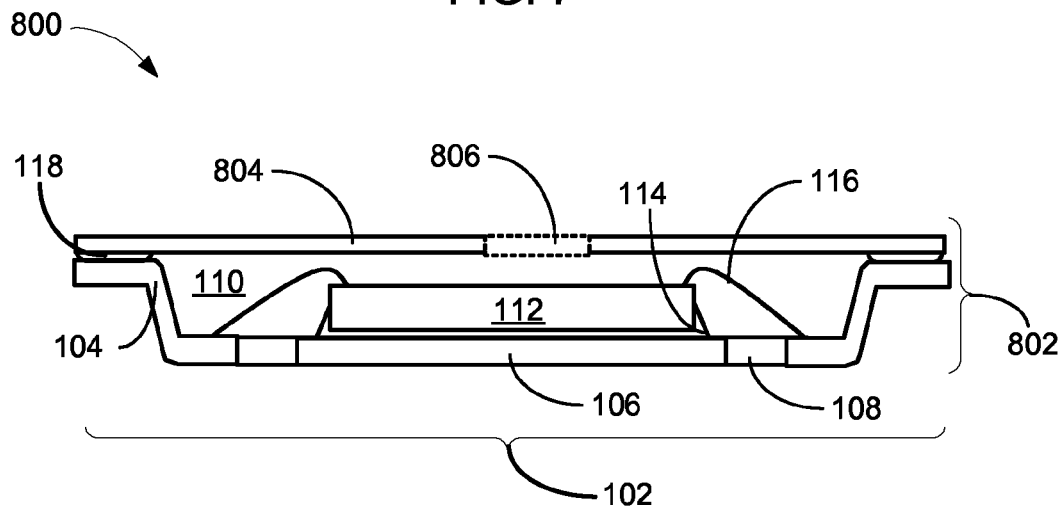
FIG. 8 is a cross-sectional view of a packaging system, in a hollow package configured as a microphone.

Referring now to FIG. 8, therein is shown a cross-sectional view of a packaging system 800, in a hollow package 802 configured as a microphone. The cross-sectional view of the packaging system 800 depicts the lead frame 102 having the terminal lead 104 that is vertically displaced from the plane of the die pad 106. The lead frame 102 may be pre-molded with the compound 108, such as a liquid crystal polymer or an epoxy molding compound. The compound 108 may fill all of the spaces between the die pad 106 and the terminal lead 104 to form the cavity 110, such as a bowl like space that is open for further assembly.

The die 112, such as a MEMS, a micro-mechanical system, or an integrated circuit device may be attached to the die pad 106 by the die attach material 114. The electrical interconnect 116, such as a bond wire couples the die 112 to the terminal lead 104. The adhesive 118, such as a non-conductive adhesive, may be applied to the top surface of the terminal lead 104 and any intervening area of the compound 108. A cover 804 may be applied on the adhesive 118, such that the cover encloses the cavity 110 and forms the hollow package 802 for the die 112.

The cover 804 may have an acoustic orifice 806 that allows activation of the die 112, such as a MEMS, that generates an electrical signal in response to acoustic energy. The acoustic orifice 806 directs the acoustic energy to an appropriate location on the die 112 for conversion. In this example, acoustic energy may enter the cavity 110 but it is understood that other types of energy or material may enter the cavity 110 for generating electrical signals.

Figure 9:
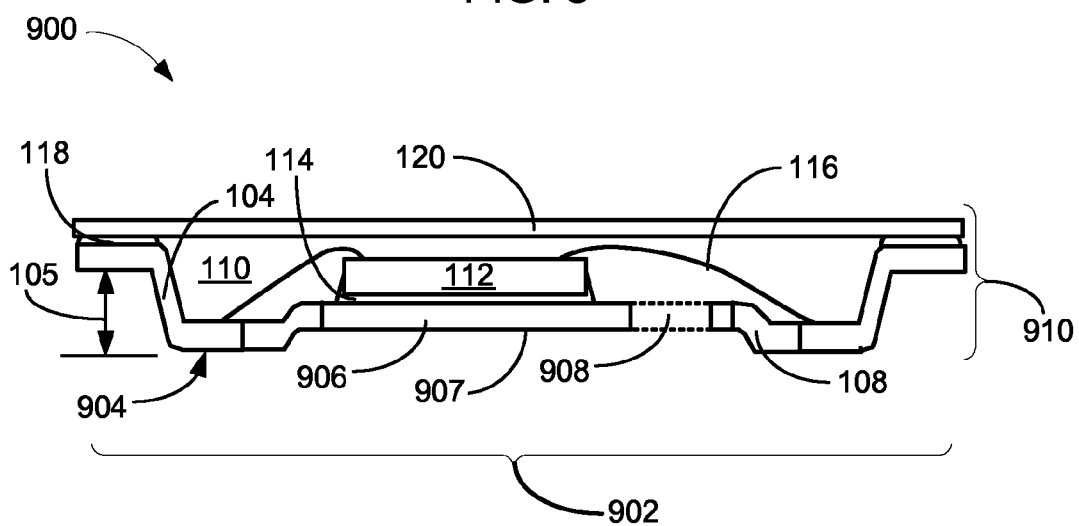
FIG. 9 is a cross-sectional view of a packaging system with hollow package, in an alternative hollow package configured as a microphone.

Referring now to FIG. 9, therein is shown a cross-sectional view of a packaging system 900 with hollow package, in an alternative construction, configured as a microphone. The cross-sectional view of the packaging system 900 depicts a lead frame 902 having the terminal lead 104 that is bent to provide the vertical displacement 105 from a bottom contact plane 904. The lead frame 902 may also have a mounting pad 906 with a bottom side 907 that is vertically displaced from the bottom contact plane 904, with an orifice 908 for allowing acoustic energy to enter the cavity 110. The compound 108 may be molded on the lead frame 902 for providing a contiguous surface and leaving only the orifice 908 as an entry to the cavity 110. In this example, acoustic energy may enter the cavity 110 but it is understood that other types of energy or material may enter the cavity 110 for generating electrical signals.

The die 112, such as a MEMS, a micro-mechanical system, or an integrated circuit device may be attached to the mounting pad 906 by the die attach material 114. The electrical interconnect 116, such as a bond wire couples the die 112 to the terminal lead 104. The adhesive 118, such as a non-conductive adhesive, may be applied to the top surface of the terminal lead 104 and any intervening area of the compound 108. The cover 120 may be applied on the adhesive 118, such that the cover encloses the cavity 110 and forms a hollow package 910 for the die 112.

Figure 10:
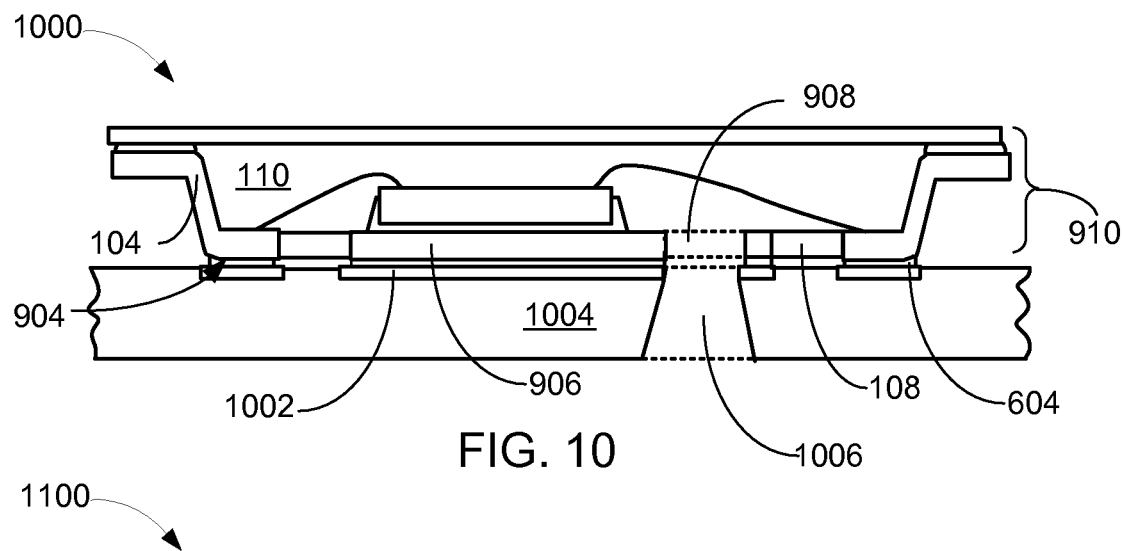
FIG. 10 is a cross-sectional view of the packaging system with hollow package, in another alternative hollow package configured as a microphone and mounted on a printed circuit board.

Referring now to FIG. 10, therein is shown a cross-sectional view of a packaging system 1000 with hollow package, in another alternative of the hollow package 910 configured as a microphone and mounted on a printed circuit board. The cross-sectional view of the packaging system 1000 depicts the hollow package 910 configured with the mounting pad 906 in the bottom contact plane 904 as are the terminal leads 104. The hollow package 910 may be electrically connected to a chip pad 1002, on a laminate substrate 1004 such as a printed circuit board, by the conductive interconnect 604. An opening 1006 in the laminate substrate 1004 is aligned with the orifice 908. This configuration allows acoustic energy to enter the cavity 110 for conversion to electrical signals. In this example, acoustic energy may enter the cavity 110 but it is understood that other types of energy or material may enter the cavity 110 for generating electrical signals.

Figure 11:
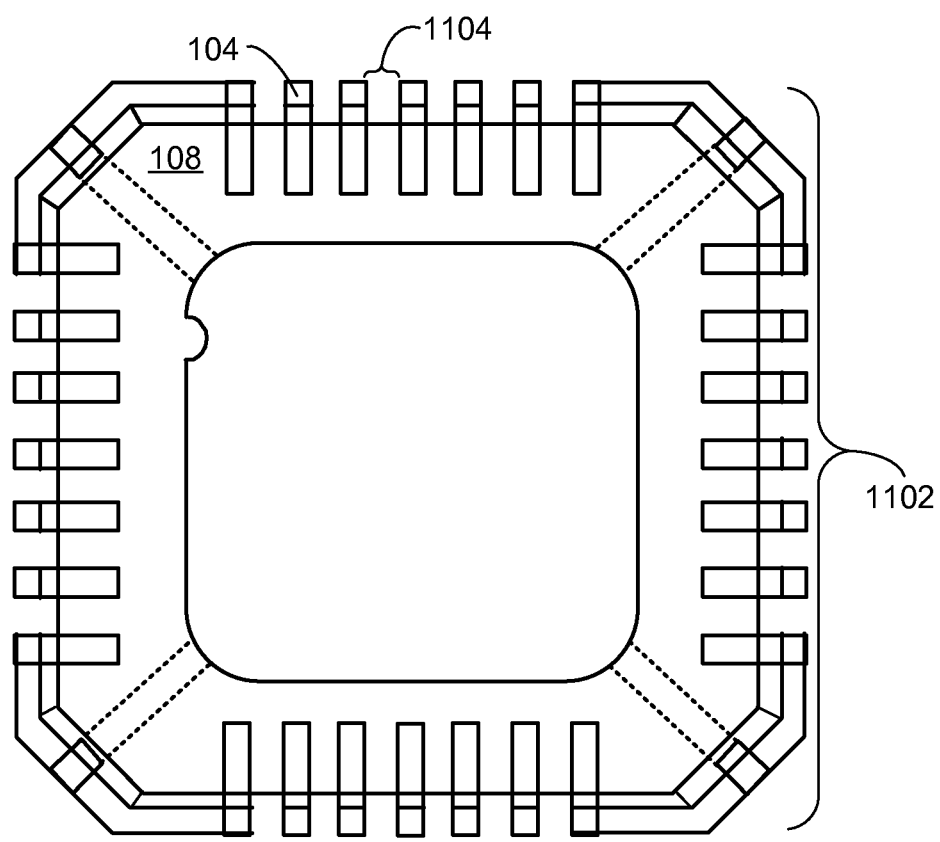
FIG. 11 is a bottom plan view of the packaging system with hollow package, in yet another alternative embodiment of the hollow package.

Referring now to FIG. 11, therein is shown a bottom plan view of a packaging system 1100 with hollow package, in yet another alternative embodiment of a hollow package 1102. The bottom plan view of the packaging system 1100 depicts the hollow package 1102 having a vent 1104 between the terminal leads 104. This configuration allows a fluid or gas to move through the hollow package 1102. Such a configuration may be useful in implementing devices including a flow meter or pressure transducer. The vent 1104 is formed during the molding process. The compound 108 may be blocked from flowing between the terminal leads 104, thus creating the vent 1104.

Figure 12:
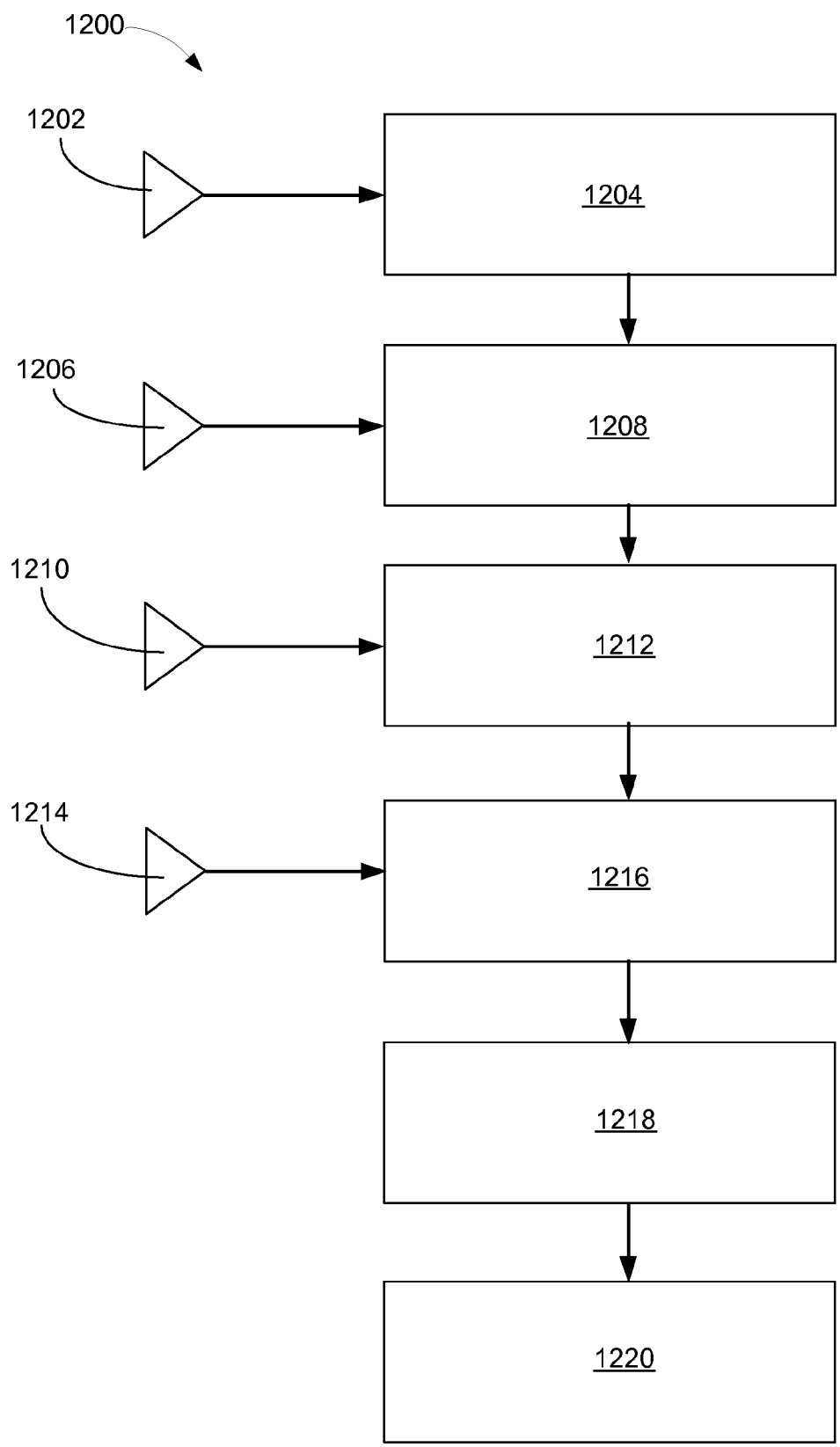
FIG. 12 is a flow diagram of a component staging for the assembly of the packaging system with hollow package.

Referring now to FIG. 12, therein is shown a flow diagram of a component staging 1200 for the assembly of the packaging system 100. The flow diagram of the component staging 1200 depicts a first component stage 1202 in which the lead frame 102, the die attach material 114, and the die 112 are combined in a die attach phase 1204. A second component stage 1206 adds the conductive interconnect 604, such as solder paste, and any passive components that may be added to the package. A discrete component attach phase 1208 may add the discrete components to the lead frame 102. A third component stage 1210 contributes the electrical interconnect 116, such as a gold bond wire. A wire bond interconnect phase 1212 uses the electrical interconnect 116 to satisfy the interconnect requirements of the packaging system 100.

A fourth component stage 1214 adds the adhesive 118 and the cover 120. A cover attach phase 1216 assembles the cover 120 on the lead frame 102 to form the hollow package 122. A lead finishing phase 1218 may perform a plating process, such as a solder plating process, a nickel palladium (NiPd) plating process, or a gold plating process, on the exposed areas of the lead frame 102. In an embodiment of the present invention, the solder plating process would represent the most cost effective plating solution for the lead finish and may be performed prior to the molding process. A singulation phase 1220 may use a saw or shear to separate a sheet of the hollow package 122 into single units.

Referring now to FIG. 13, therein is shown a cross-sectional view of a lead frame sheet 1300, in a preparation phase of manufacturing. The cross-sectional view of the lead frame sheet 1300 depicts a series of the lead frame 102 joined by the terminal lead 104. The compound 108 may be molded throughout the lead frame 102 forming a solid bowl-like structure.

The lead frame sheet 1300 is displayed as having three units formed in the sheet. This is by of an example only and it is understood that any number of the lead frame 102 may be joined in an "X-Y" array. This indicates that the lead frame sheet 1300 may actually have X units in a column and Y units in a row, where X and Y are whole numbers.

Referring now to FIG. 14, therein is shown a cross-sectional view of a pre-molded lead frame sheet 1400, in a die attach phase of manufacturing. The cross-sectional view of the pre-molded lead frame sheet 1400 depicts the die attach material 114 and the die 112 positioned on the die pad 106 of the lead frame 102.

The pre-molded lead frame sheet 1400 is displayed as having three units formed in the sheet. This is by of an example only and it is understood that any number of the lead frame 102 may be joined in an "X-Y" array. This indicates that the pre-molded lead frame sheet 1400 may actually have X units in a column and Y units in a row, where X and Y are whole numbers.

Referring now to FIG. 15, therein is shown a cross-sectional view of a pre-molded lead frame sheet 1500, in a wire bond phase of manufacturing. The cross-sectional view of the pre-molded lead frame sheet 1500 depicts the electrical interconnect 116 making an electrical connection between the die 112 and the terminal lead 104.

The pre-molded lead frame sheet 1500 is displayed as having three units formed in the sheet. This is by of an example only and it is understood that any number of the lead frame 102 may be joined in an "X-Y" array. This indicates that the pre-molded lead frame sheet 1500 may actually have X units in a column and Y units in a row, where X and Y are whole numbers.

Referring now to FIG. 16, therein is shown a cross-sectional view of a package sheet 1600, in a cover seal phase of manufacturing. The cross-sectional view of the package sheet 1600 depicts the adhesive 118 applied between the terminal lead 104 and the cover 120 creating the cavity 110.

The package sheet 1600 is displayed as having three units formed in the sheet. This is by of an example only and it is understood that any number of the lead frame 102 may be joined in an "X-Y" array. This indicates that the package sheet 1600 may actually have X units in a column and Y units in a row, where X and Y are whole numbers.

Referring now to FIG. 17, therein is shown a cross-sectional view of the hollow package 122, in a singulation phase of manufacturing. The cross-sectional view of the hollow package 122 depicts a series of the hollow package 122 after having been singulated by a saw or shear process. This example displays only three of the hollow package 122, but it is understood that the actual number of hollow packages 122 may be different.

Figure 18:
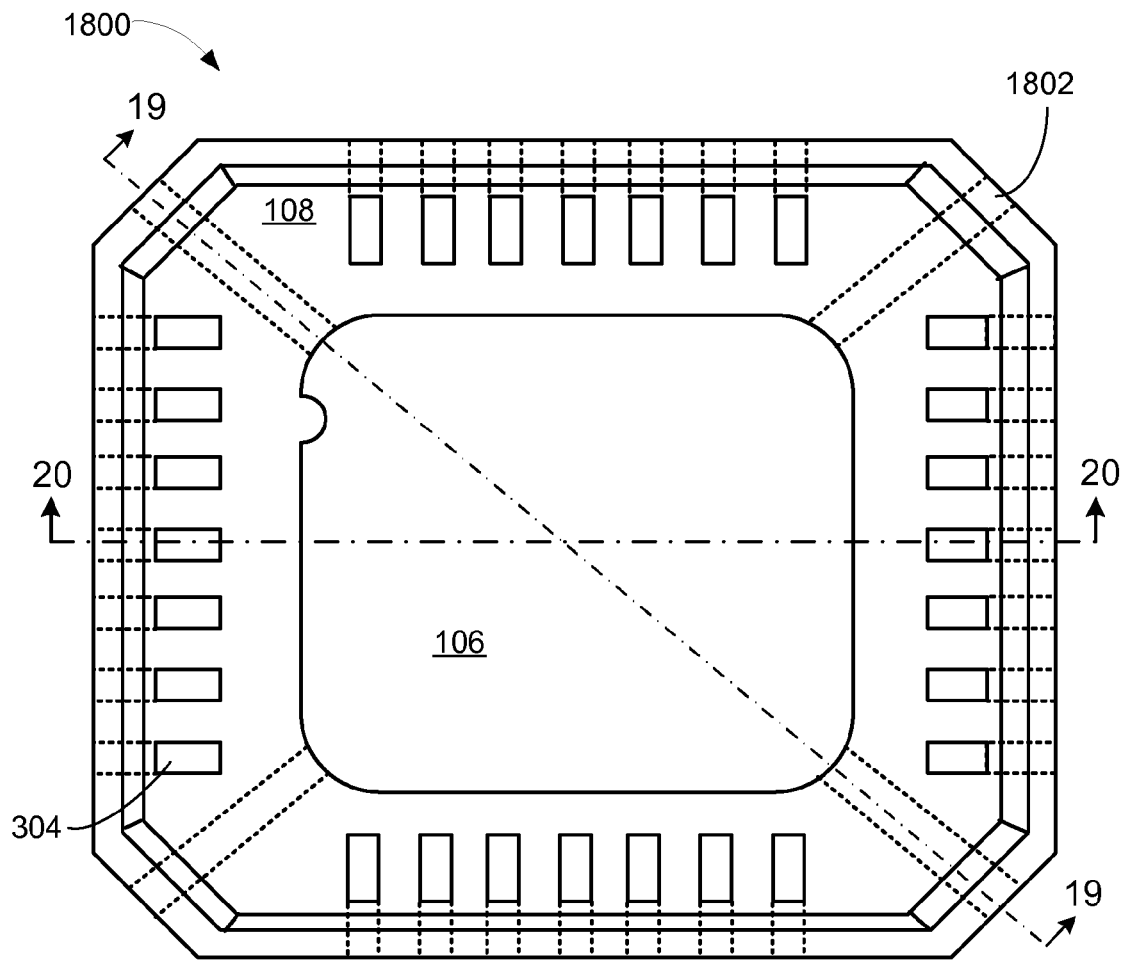
FIG. 18 is a bottom plan view of a packaging system with hollow package.

Referring now to FIG. 18, therein is shown a bottom plan view of a packaging system 1800 with hollow package. The bottom plan view of the packaging system 1800 depicts the die pad 106 having tie bars 1802 that are half etched. The tie bars 1802 are partially encapsulated by the compound 108. The small contact area 304 remains exposed through the compound 108 while the remainder of the terminal lead 104 is covered by the compound 108, making it unavailable for electrical connection on the outside of the package. The packaging system 1800 also depicts a first section line 19-19 that runs through the tie bars 1802 and a second section line 20-20 that runs through the terminal leads 104.

Figure 19:
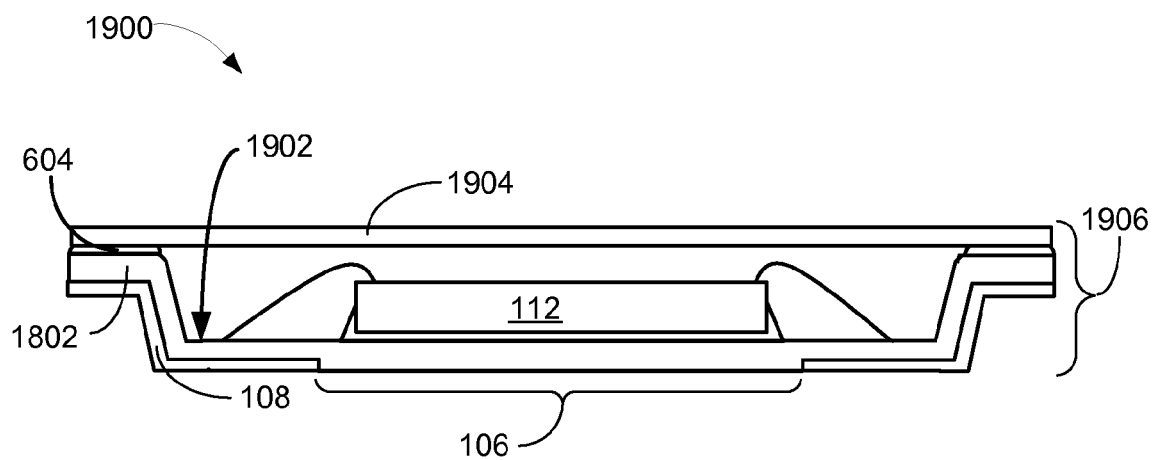
FIG. 19 is a cross-sectional view of a packaging system taken along the section line 19-19 of FIG. 18.

Referring now to FIG. 19, therein is shown a cross-sectional view of a packaging system 1900 taken along the section line 19-19 of FIG. 18. The cross-sectional view of the packaging system 1900 depicts the die pad 106 with the tie bars 1802 half etched to allow the compound 108 to partially encapsulate the tie bars 1802. The partially encapsulated tie bars 1802 have the compound 108 filling the free space around them while at least a surface 1902 is left uncovered for electrical connection.

The conductive interconnect 604, such as solder or conductive epoxy, forms an electrical connection between the tie bars 1802 and a conductive cover 1904. In this configuration, the conductive cover 1904, such as a metal cover, may act as an electrical shield for the die 112 mounted in a hollow package 1906.

Figure 20:
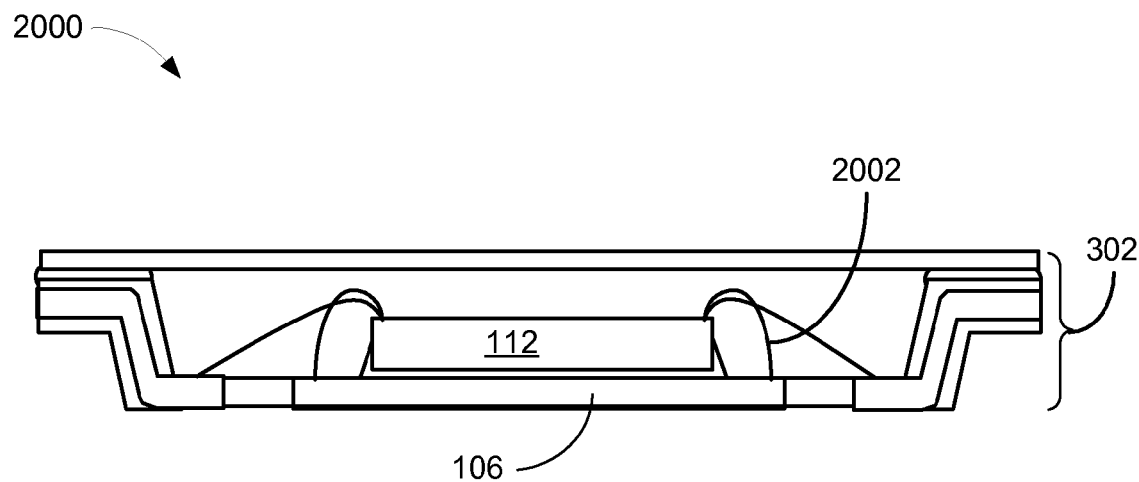
FIG. 20 is a cross-sectional view of a package system taken along the section line 20-20 of FIG. 18.

Referring now to FIG. 20, therein is shown a cross-sectional view of a packaging system 2000 taken along the section line 20-20 of FIG. 18. The cross-sectional view of the package system 2000 depicts the hollow package 302 having a down bond electrical interconnect 2002 that couples the die 112 to the die pad 106. This technique is usually employed to provide additional grounding to the die 112.

Figure 21:
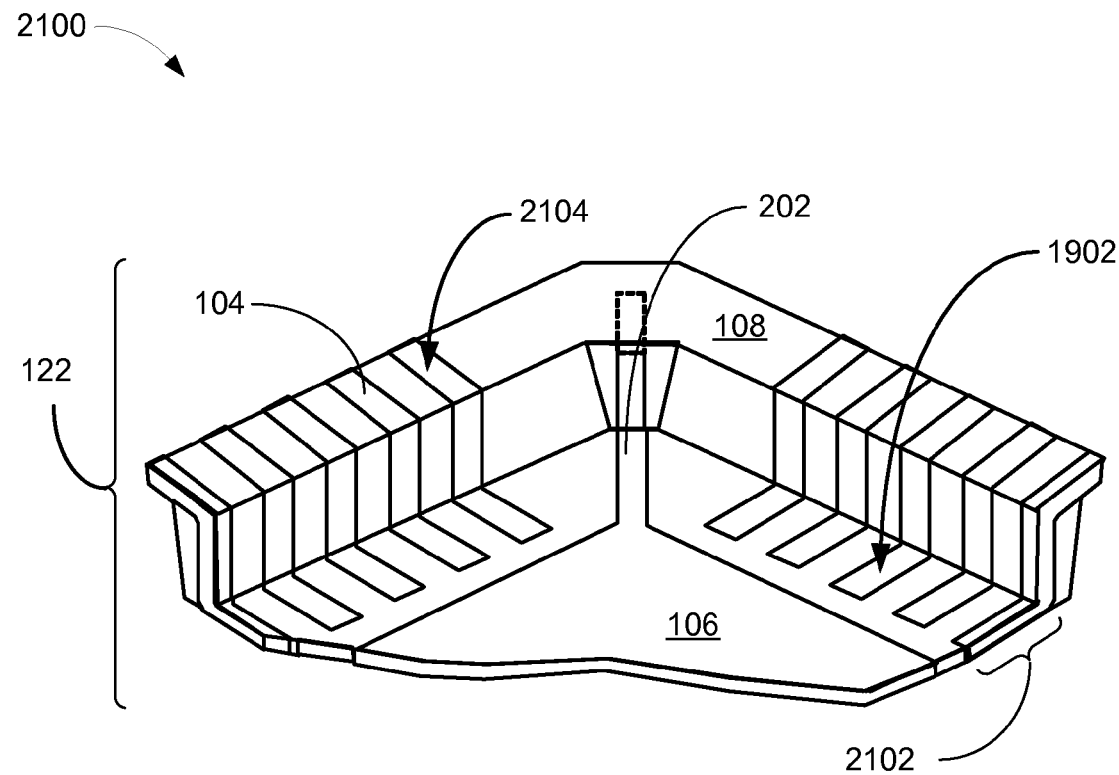
FIG. 21 is an isometric view of a corner section of the inside of the cavity of FIG. 1.

Referring now to FIG. 21, therein is shown an isometric view of a corner section 2100 of the inside of the hollow package 122 of FIG. 1. The isometric view of the corner section 2100 of the inside of the cavity 110 depicts the terminal leads 104 partially encapsulated by the compound 108. A bottom contact 2102 is not covered by the compound 108, while the space between the terminal leads 104, the die pad 106, and the tie bars 202 has been partially encapsulated. The surface 1902 is also not covered by the compound 108.

In an embodiment of the present invention a top surface 2104 of the terminal leads 104 may be covered by the compound 108. In the event that the cover 120 is a metal, the compound 108 acts as an insulator for the terminal leads 104 and the cover may be electrically connected to the tie bars 202.

Figure 22:
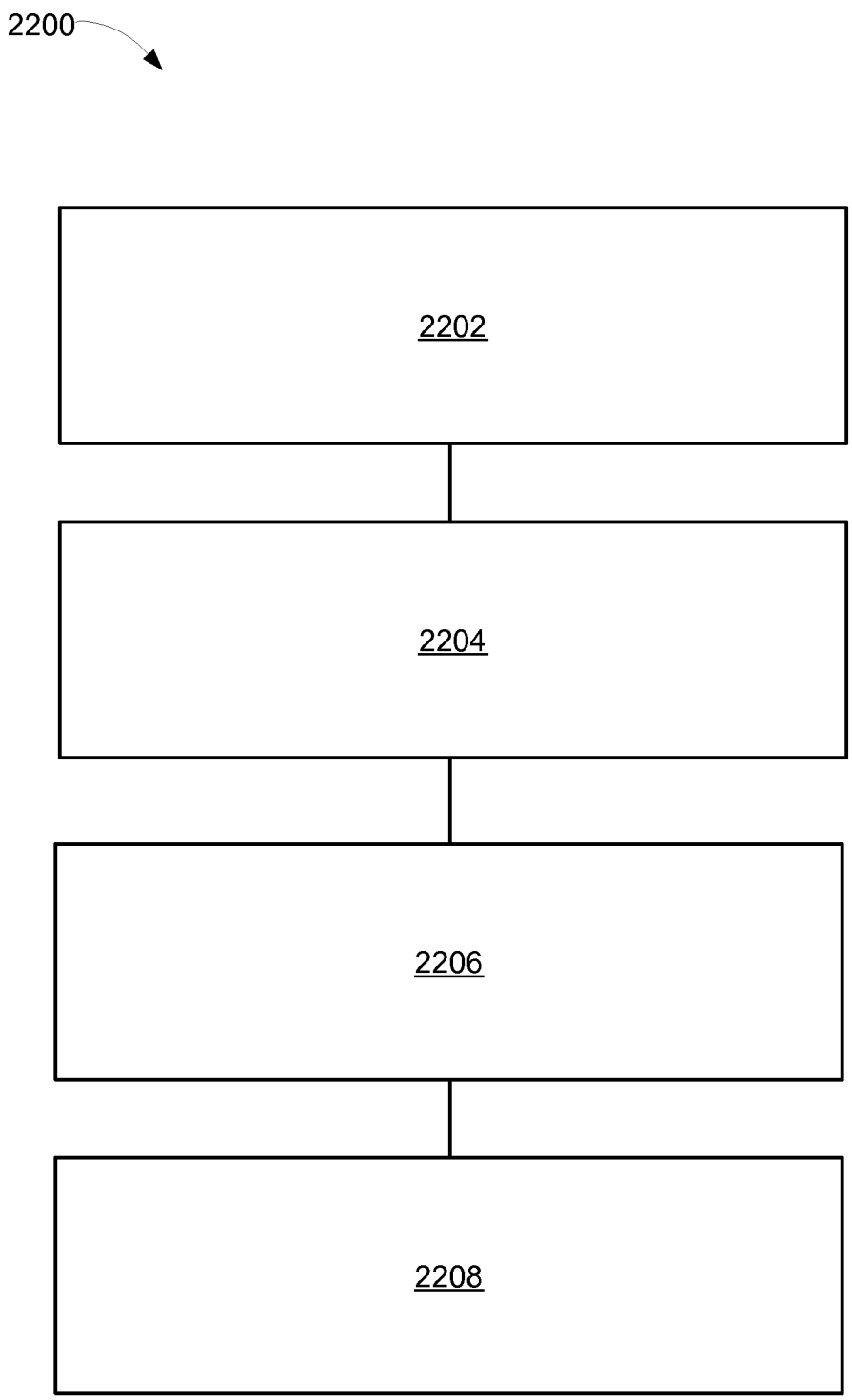
FIG. 22 is a flow chart of a packaging system with hollow package for manufacturing the packaging system with hollow package in an embodiment of the present invention.

Referring now to FIG. 22, therein is shown a flow chart of a packaging system 2200 for manufacturing the packaging system 100 in an embodiment of the present invention. The system 1800 includes forming a hollow package including: forming terminal leads in a block 2202; configuring a cavity by partially encapsulating the terminal leads with a compound in a block 2204; attaching an integrated circuit device, a micro-electromechanical system, a micro-mechanical system, or a combination thereof in the cavity in a block 2206; and bonding a cover to the terminal leads for enclosing the cavity in a block 2208.

A principle aspect of the present invention is that it allows molding the lead frame using a conventional transfer molding process.

Another aspect is that the present invention allows a plain sheet of material to be used as the cover and it simplifies the cover attachment process. The present invention is also suitable for high volume production and supports low cost manufacturing.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the packaging system of the present invention furnishes important and heretofore unknown and unavailable solutions, capabilities, and functional aspects for volume manufacture. The resulting processes and configurations are straightforward, cost-effective, uncomplicated, highly versatile and effective, can be surprisingly and unobviously implemented by adapting known technologies, and are thus readily suited for efficiently and economically manufacturing micro electromechanical system devices fully compatible with conventional manufacturing processes and technologies. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   forming terminal leads bent providing a vertical displacement from a bottom contact plane;
   configuring a compound and the terminal leads to have a cavity by partially encapsulating the terminal leads with the compound including molding the compound on and between the terminal leads;
   attaching an integrated circuit device, a micro-electromechanical system, a micro-mechanical system, or a combination thereof in the cavity by electrically connecting the integrated circuit device, the micro-electromechanical system, the micro-mechanical system, or a combination thereof to the terminal leads;
   applying a non-conductive adhesive on the terminal leads; and
   bonding a cover to the terminal leads with the non-conductive adhesive isolating the terminal leads from the cover enclosing the cavity with the non-conductive adhesive between the terminal leads, the compound, and the cover, with the compound and the terminal leads entirely under the cover and not visible when looking at the cover.

2. The method as claimed in claim 1 wherein configuring the compound includes encapsulating the terminal leads to form a vent therebetween.

3. The method as claimed in claim 1 wherein configuring the compound includes molding the compound around the terminal leads leaving a portion of the terminal leads exposed forming a leadless package.

4. The method as claimed in claim 1 wherein:
   bonding the cover to the terminal leads includes bonding a conductive laminate substrate to the terminal leads; and
   further comprising:
   forming a conductive interconnect between the terminal leads and the conductive laminate substrate above, below, or both above and below the cavity; and
   mounting an additional integrated circuit device, and additional micro-electromechanical system, an additional micro-mechanical system, or a combination thereof on the conductive laminate substrate.

5. The method as claimed in claim 1 wherein configuring the compound includes creating a recess on a bottom side thereof.

6. The method as claimed in claim 1 wherein bonding the cover includes bonding the cover having an acoustic orifice.

7. The method as claimed in claim 1 wherein configuring the compound by partially encapsulating the terminal leads with the compound includes molding the compound around the terminal leads leaving a portion of the terminal leads exposed forming a leadless package including having a top contact pad and the bottom contact plane in which the terminal leads are plated with solder, nickel, palladium, or gold.

8. The method as claimed in claim 1 wherein:
   bonding the cover to the terminal leads includes bonding a conductive laminate substrate to the terminal leads including applying the conductive laminate substrate having a bottom contact pad, a conductive link, and a top contact pad; and further comprising:
   forming a conductive interconnect between the terminal leads and the conductive laminate substrate above, below, or both above and below the cavity; and
   mounting an additional integrated circuit package, an additional MEMS package, an additional micro-mechanical system, or a combination thereof on the conductive laminate substrate including mounting the additional integrated circuit package, the additional MEMS package, the additional micro-mechanical system, or the combination thereof on the top contact pad.

9. The method as claimed in claim 1 wherein configuring the compound includes forming the terminal leads having a recess on a bottom side thereof including positioning a mounting pad vertically displaced from the bottom contact plane.

10. A packaging system comprising:
terminal leads bent providing a vertical displacement from a bottom contact plane;
a compound and the terminal leads configured to have a cavity by partially encapsulating the terminal leads with the compound, with the compound molded on and between the terminal leads;
an integrated circuit device, a micro-electromechanical system, a micro-mechanical system, or a combination thereof attached in the cavity and electrically connected to the terminal leads;
a non-conductive adhesive on the terminal leads; and
a cover bonded to the terminal leads with the non-conductive adhesive and electrically isolated from the terminal leads enclosing the cavity by the non-conductive adhesive applied between the terminal leads, the compound, and the cover, with the compound and the terminal leads entirely under the cover and not visible when looking at the cover.

11. The system as claimed in claim 10 wherein the terminal leads have a vent therebetween.

12. The system as claimed in claim 10 wherein the terminal leads are partially encapsulated with the compound molded around the terminal leads with a portion of the terminal leads exposed forming a leadless package.

13. The system as claimed in claim 10 wherein:
the cover bonded to the terminal leads includes a conductive laminate substrate bonded to the terminal leads;
further comprising a conductive interconnect formed between the terminal leads and the conductive laminate substrate above, below, or both above and below the cavity; and
an additional integrated circuit device, an additional micro-electromechanical system, an additional micro-mechanical system, or a combination thereof mounted on the conductive laminate substrate.

14. The system as claimed in claim 10 wherein the terminal leads and the compound are configured having a recess on the bottom side thereof.

15. The system as claimed in claim 10 wherein the cover includes an acoustic orifice.

16. The system as claimed in claim 10 wherein the terminal leads partially encapsulated with the compound includes the compound molded around the terminal leads with a portion of the terminal leads left exposed forms a leadless package including having a top contact pad and the bottom contact plane in which the terminal leads are plated with solder, nickel palladium, or gold.

17. The system as claimed in claim 10 wherein:
the cover bonded to the terminal leads includes a conductive laminate substrate bonded to the terminal leads, the conductive laminate substrate having a bottom contact pad, a conductive link, and a top contact pad;
further comprising a conductive interconnect formed between the terminal leads and the conductive laminate substrate above, below, or both above and below the cavity; and
an additional integrated circuit device, an additional micro-electromechanical system, an additional micro-mechanical system, or a combination thereof mounted on the conductive laminate substrate includes a package-on-package configuration.

18. The system as claimed in claim 10 wherein the terminal leads and the compound have a recess on a bottom side thereof and includes a mounting pad vertically displaced from the bottom contact plane.

* * * * *

UNITED STATES PATENT AND TRADEMARK OFFICE
CERTIFICATE OF CORRECTION

| | | |
|---|---|---|
| PATENT NO. | : 8,493,748 B2 | Page 1 of 1 |
| APPLICATION NO. | : 11/769520 | |
| DATED | : July 23, 2013 | |
| INVENTOR(S) | : Camacho et al. | |

It is certified that error appears in the above-identified patent and that said Letters Patent is hereby corrected as shown below:

In the Claims:

Column 10, claim 4, line 39, delete "device, and" and insert therefor --device, an--

Signed and Sealed this
First Day of December, 2015

Michelle K. Lee
*Director of the United States Patent and Trademark Office*